United States Patent
Hwang

(10) Patent No.: US 9,628,728 B2
(45) Date of Patent: Apr. 18, 2017

(54) RAMP SIGNAL GENERATOR AND IMAGE SENSOR INCLUDING THE SAME

(71) Applicant: SK hynix Inc., Gyeonggi-do (KR)

(72) Inventor: Won-Seok Hwang, Gyeonggi-do (KR)

(73) Assignee: SK Hynix Inc., Gyeonggi-do (KR)

( * ) Notice: Subject to any disclaimer, the term of this patent is extended or adjusted under 35 U.S.C. 154(b) by 76 days.

(21) Appl. No.: 14/858,952

(22) Filed: Sep. 18, 2015

(65) Prior Publication Data

US 2016/0330387 A1 Nov. 10, 2016

(30) Foreign Application Priority Data

May 7, 2015 (KR) ........................ 10-2015-0064002

(51) Int. Cl.
*H04N 5/357* (2011.01)
*H04N 5/369* (2011.01)
*H04N 5/378* (2011.01)
*H03K 4/90* (2006.01)

(52) U.S. Cl.
CPC ............... *H04N 5/357* (2013.01); *H03K 4/90* (2013.01); *H04N 5/3698* (2013.01); *H04N 5/378* (2013.01)

(58) Field of Classification Search
CPC .... H04N 5/3577; H04N 5/3355; H04N 5/357; H04N 5/3698; H04N 5/378; H03K 4/90
USPC ....................................................... 348/241
See application file for complete search history.

(56) References Cited

U.S. PATENT DOCUMENTS

| | | | | |
|---|---|---|---|---|
| 7,218,265 B2* | 5/2007 | Roh | ...................... | H03M 1/181 341/155 |
| 7,342,328 B1* | 3/2008 | Eddleman | ................. | H02J 1/10 307/80 |
| 8,305,474 B2* | 11/2012 | Purcell | ................. | H04N 5/3355 348/294 |
| 2006/0290552 A1* | 12/2006 | Roh | ...................... | H03M 1/181 341/155 |
| 2010/0157035 A1* | 6/2010 | Purcell | ................. | H04N 5/3577 348/65 |
| 2011/0292261 A1* | 12/2011 | Hwang | ................ | H04N 5/3575 348/294 |
| 2014/0055176 A1* | 2/2014 | Zhang | ...................... | H03K 4/00 327/137 |

FOREIGN PATENT DOCUMENTS

JP 2010-251914 11/2010
KR 1020060077097 7/2006

* cited by examiner

*Primary Examiner* — Pritham Prabhakher
(74) *Attorney, Agent, or Firm* — IP & T Group LLP

(57) ABSTRACT

A ramp signal generator may include: a differential amplification unit suitable for generating an amplified signal corresponding to a voltage difference between a reference voltage and a feedback voltage; a driving unit suitable for driving an output terminal of the feedback voltage to a ground voltage in response to the amplified signal, and generating the feedback voltage corresponding to the reference voltage; and a ramp signal generation unit suitable for generating a ramp signal using a ramp supply voltage and the feedback voltage.

11 Claims, 3 Drawing Sheets

RAMP SIGNAL GENERATOR AND IMAGE SENSOR INCLUDING THE SAME

CROSS-REFERENCE TO RELATED APPLICATIONS

The present application claims priority of Korean Patent Application No. 10-2015-0064002, filed on May 7, 2015, which is incorporated herein by reference in its entirety.

BACKGROUND

1. Field

Various embodiments of the present invention relate to an image sensor, and more particularly, to a ramp signal generator with a noise cancelling function and an image sensor including the same.

2. Description of the Related Art

In a typical image sensor with column-parallel structure, since pixel signals having power noise are outputted to a readout circuit, pixel data outputted from the readout circuit includes the power noise.

The power noise coming from pixels may be supply noise, ground noise, both, or any other type of noise.

Since pixel power noise is one of the largest contributors of horizontal noise (HN) in an image sensor, it should be reduced as much as possible.

A switched current ramp signal generator generates a ramp signal by forcing a switching current into a ramp resistor coupled to a ramp ground power supply. In the switched current ramp signal generator, ramp ground bouncing may occur due to line/pad resistance of the ramp ground power supply. The ground power supply of a pixel is used as the ramp ground power supply.

Such ramp ground bouncing of the switched current ramp signal generator serves as a power noise source and has an influence on horizontal noise of the image sensor. Thus, the ramp ground bouncing must be reduced as much as possible.

SUMMARY

Various embodiments are directed to a ramp signal generator capable of controlling ramp ground bouncing, and an image sensor including the same.

Further, various embodiments are directed to a ramp signal generator capable of incorporating pixel power noise into a ramp signal and controlling ramp ground bouncing, and an image sensor including the same.

In an embodiment, a ramp signal generator may include: a differential amplification unit suitable for receiving a reference voltage and a voltage of a transfer node, corresponding to the reference voltage as differential inputs; a driving unit suitable for receiving an output signal of the differential amplification unit and being coupled between the transfer node and a ramp ground voltage terminal; and a ramp signal generation unit suitable for generating a ramp signal based on a ramp supply voltage and the voltage of the transfer node.

The ramp signal generation unit may include: a ramp current generation unit coupled between a ramp supply voltage terminal and a ramp signal output terminal, and suitable for generating a ramp current corresponding to the ramp signal; and a ramp resistor coupled between the ramp signal output terminal and the transfer node.

In an embodiment, a ramp signal generator may include: a reference voltage generation unit suitable for generating a reference voltage using pixel powers; a noise control unit suitable for generating a voltage corresponding to the reference voltage using a ramp ground voltage; and a ramp signal generation unit suitable for generating a ramp signal based on a ramp supply voltage and the voltage generated from the noise control unit.

The reference voltage may contain pixel power noise, and the pixel power noise may be incorporated into the voltage generated from the noise control unit and the ramp signal without containing noise caused by ramp ground bouncing.

The noise control unit may include a voltage regulator suitable for controlling ramp ground bouncing based on the reference voltage to cancel noise caused by the ramp ground bouncing.

The noise control unit may include: a differential amplification unit suitable for receiving the reference voltage and the voltage generated from the noise control unit, as differential inputs; and a driving unit suitable for receiving an output signal of the differential amplification unit and being coupled between an output terminal of the noise control unit and a ramp ground voltage terminal.

The ramp signal generation unit may include: a ramp current generation unit coupled between the ramp supply voltage terminal and a ramp signal output terminal, and suitable for generating a ramp current corresponding to the ramp signal; and a ramp resistor coupled between the ramp signal output terminal and an output terminal of the noise control unit.

The pixel power may include a pixel supply voltage and a pixel ground voltage, the pixel supply voltage and the ramp supply voltage are electrically separated, and the pixel ground voltage and the ramp ground voltage are electrically separated.

In an embodiment, a CIS may include: a pixel array suitable for generating a pixel signal in which a pixel power noise is incorporated using a pixel supply voltage and a pixel ground voltage;

A ramp signal generator suitable for generating a ramp signal on which the pixel power noise is reflected using the pixel supply voltage, the pixel ground voltage, a ramp supply voltage, and a ramp ground voltage; and a comparator suitable for comparing the pixel signal and the ramp signal.

The ramp signal generator may control ramp ground bouncing to cancel noise caused by the ramp ground bouncing.

The ramp signal generator may include: a reference voltage generation unit suitable for generating a reference voltage on which the pixel power noise is reflected, using the pixel supply voltage and the pixel ground voltage; a noise control unit suitable for generating a voltage corresponding to the reference voltage using the ramp ground voltage; and a ramp signal generation unit suitable for generating the ramp signal based on the ramp supply voltage and the voltage generated from the noise control unit.

The noise control unit may include a voltage regulator suitable for controlling ramp ground bouncing based on the reference voltage to cancel the noise caused by the ramp ground bouncing.

The noise control unit may include: a differential amplification unit suitable for receiving the reference voltage and the voltage generated from the noise control unit, as differential inputs; and a driving unit suitable for receiving an output signal of the differential amplification unit and being coupled between an output terminal of the noise control unit and a ramp ground voltage terminal.

The ramp signal generation unit may include: a ramp current generation unit coupled between the ramp supply voltage terminal and a ramp signal output terminal and suitable for generating a ramp current corresponding to the ramp signal; and a ramp resistor coupled between the ramp signal output terminal and an output terminal of the noise control unit.

The pixel supply voltage and the ramp supply voltage may be electrically separated, and the pixel ground voltage and the ramp ground voltage may be electrically separated.

The comparator may offset the pixel power noise contained in the pixel signal by using the ramp signal in which the pixel power noise is incorporated, and generate a comparison signal from which the power pixel noise is canceled.

DETAILED DESCRIPTION

Figure 1:
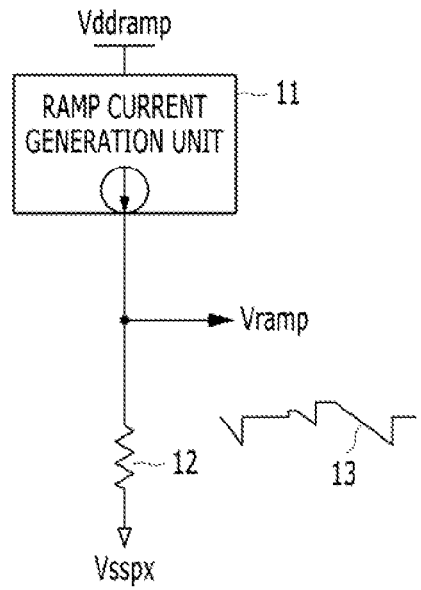
FIG. 1 is a diagram illustrating a switched current ramp signal generator.

Various embodiments will be described below in more detail with reference to the accompanying drawings. The present invention may, however, be embodied in different forms and should not be construed as limited to the embodiments set forth herein. Rather, these embodiments are provided so that this disclosure will be thorough and complete, and will fully convey the scope of the present invention to those skilled in the art. Throughout the disclosure, like reference numerals refer to like parts throughout the various figures and embodiments of the present invention.

The drawings are not necessarily to scale and, in some instances, proportions may have been exaggerated to clearly illustrate features of the embodiments. It is also noted that in this specification, "connected/coupled" refers to one component not only directly coupling another component, but also indirectly coupling another component through an intermediate component. In addition, a singular form may include a plural form as long as it is not specifically mentioned.

FIG. 1 is a diagram illustrating a switched current ramp signal generator. FIG. 1 illustrates the configuration of an ideal switched current ramp signal generator and the waveform 13 of a ramp signal VRAMP generated from the switched current ramp signal generator.

Figure 2:
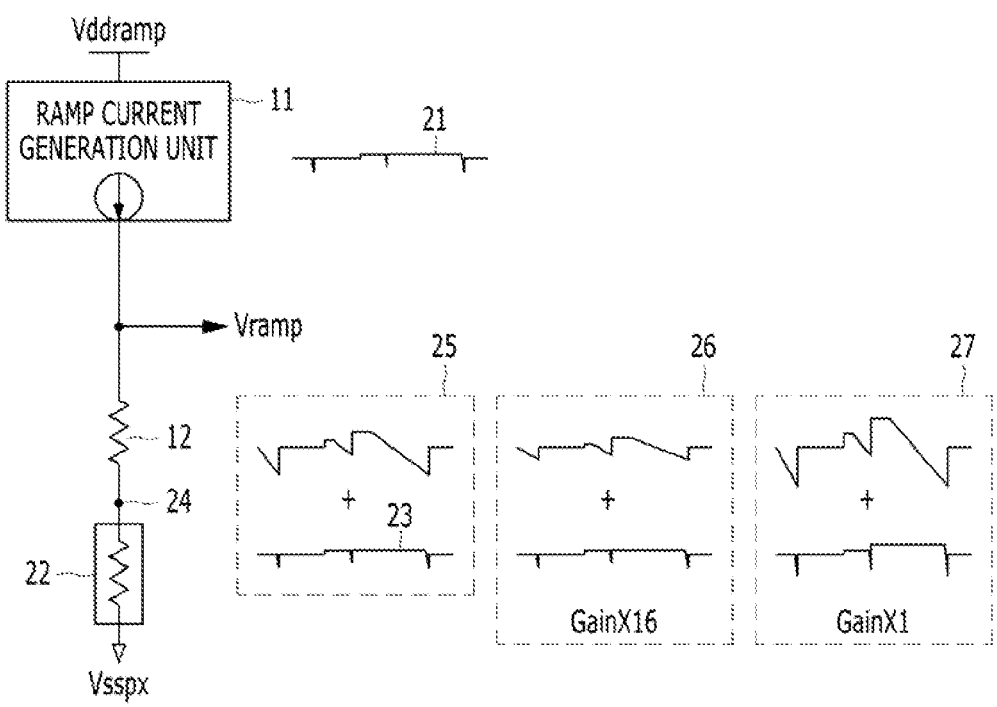
FIG. 2 is a diagram for describing ramp ground bouncing which is dependent on a gain of the switched current amp signal generator shown in FIG. 1.

FIG. 2 is a diagram illustrating ramp ground bouncing which is dependent on a gain of the switched current amp signal generator shown in FIG. 1. FIG. 2 illustrates waveforms of a ramp signal 25 which is generated when ramp ground bouncing 23 caused by line/pad resistance 22 exists in a ramp ground node 24.

As illustrated in FIGS. 1 and 2, the switched current ramp signal generator may include a ramp current generation unit 11 and a ramp resistor 12. The ramp current generation unit 11 may generate a ramp current through a switching current based on a ramp supply voltage Vddramp. The ramp resistor 12 may be coupled to a ramp ground power supply terminal Vsspx and the ramp current from the ramp current generation unit 11 may be forced to the ramp current to output a ramp signal 13.

The ramp current generation unit 11 may be implemented in a switched current type, and a ground power supply Vsspx of a pixel may be used as the ramp ground power supply.

In the switched current ramp signal generator which generates a ramp waveform by forcing a ramp current 21 to the ramp resistor 12 coupled to the ramp ground power supply terminal Vsspx, ramp ground bouncing 23 may occur due to the line/pad resistance 22 of the ramp ground power supply. The ramp ground bouncing 23 may deepen as the switched current ramp signal generator uses a large amount of current (gain×16→gain×1, refer to reference numerals 26 and 27) and the resistance of the ground line increases.

Furthermore, the switched current ramp signal generator which is currently used may use the ground power supply Vsspx of the pixel as the ramp ground power supply. In this case, pixel ground noise may be offset through a differential input terminal of correlated double sampling (CDS), but ramp noise may be contained into a pixel signal.

Figure 3:
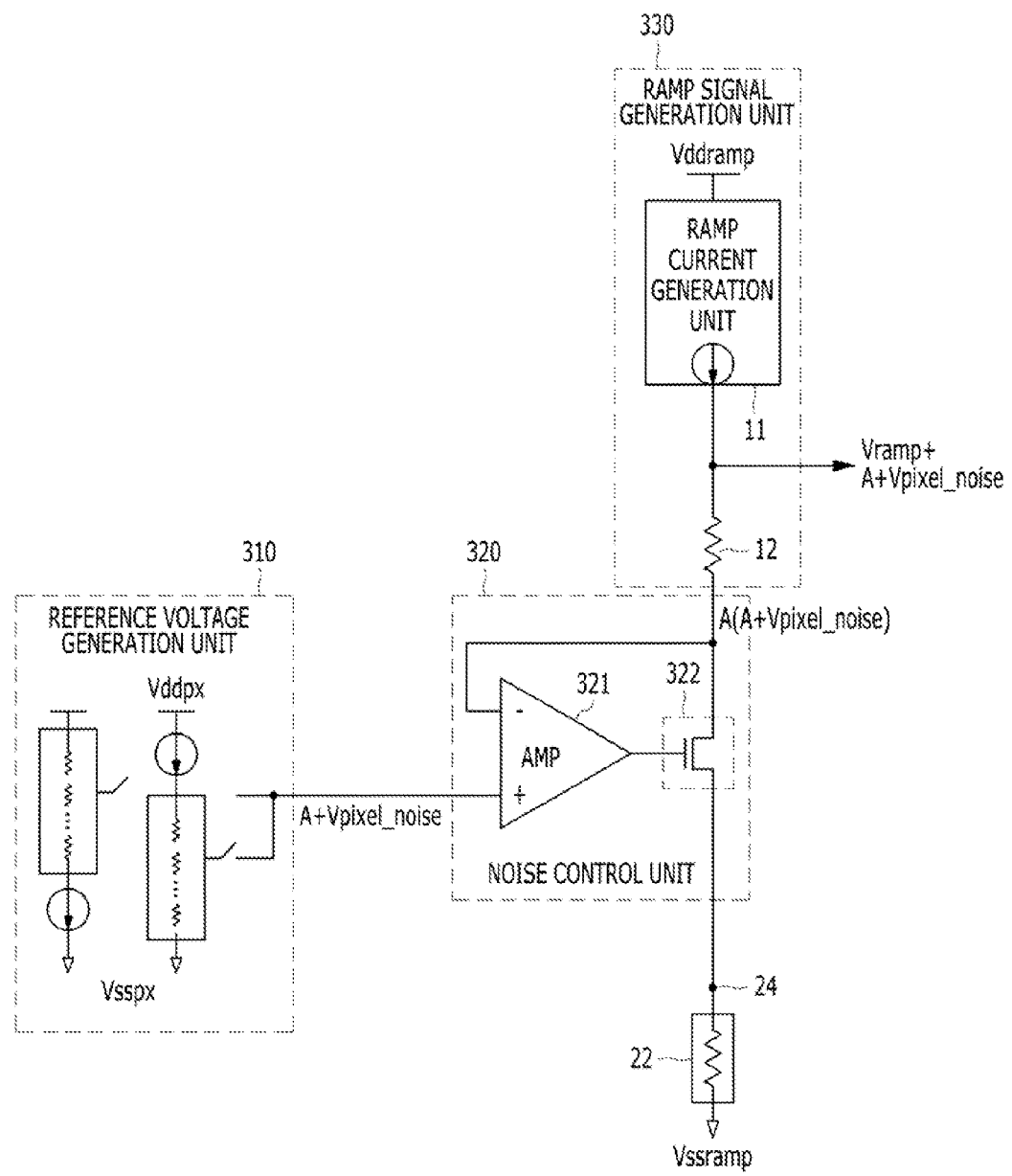
FIG. 3 is a diagram illustrating a ramp signal generator with a noise cancelling function in accordance with an embodiment of the present invention.
Figure 4:
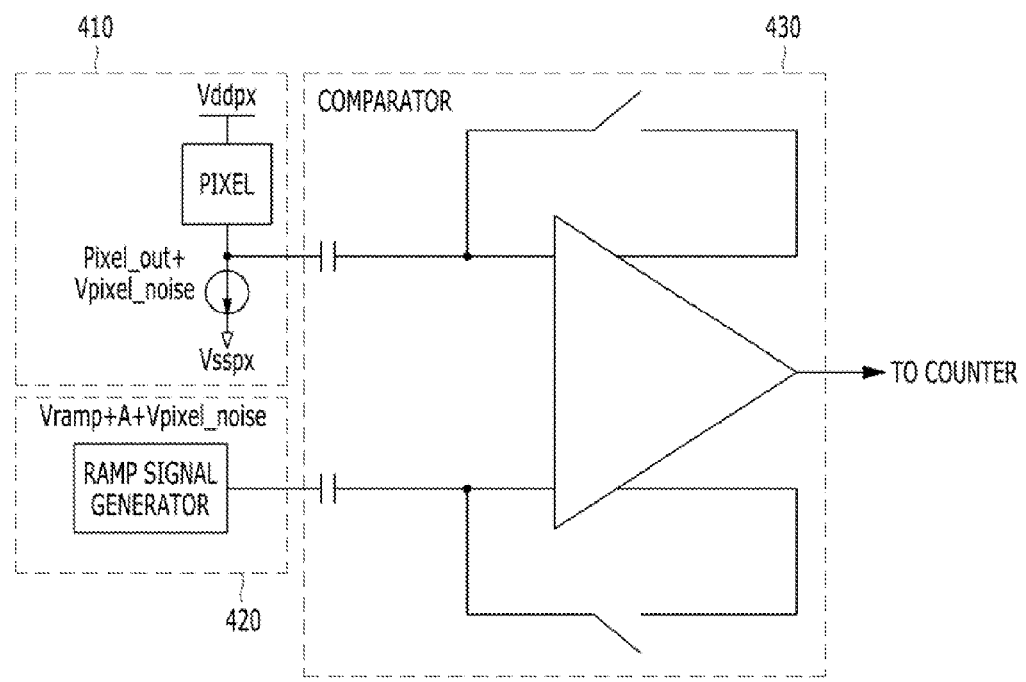
FIG. 4 is a diagram of an image sensor in accordance with an embodiment of the present invention.

Thus, a ramp signal generator in accordance with an embodiment of the present invention may control ramp ground bouncing through a voltage regulator and remove high-frequency noise caused by the ramp ground bouncing. Furthermore, the ramp signal generator may incorporate pixel power noise into a ramp signal through a voltage generated from pixel power, such that power noise from a pixel is offset at a differential input terminal of CDS. Referring to FIGS. 3 and 4, the ramp signal generator in accordance with the embodiment of the present invention will be described in detail as follows.

FIG. 3 is a diagram illustrating a ramp signal generator with a noise cancelling function in accordance with an embodiment of the present invention. FIG. 3 illustrates the configuration of a switched current ramp signal generator.

As illustrated in FIG. 3, the ramp signal generator may include a reference voltage generation unit 310, a noise control unit 320, and a ramp signal generation unit 330. The reference voltage generation unit 310 may generate a reference voltage A+Vpixel_noise, in which pixel power noise is contained, using pixel powers Vddpx and Vsspx. The noise control unit 320 may cancel noise by controlling ramp ground bouncing, and transfer the reference voltage A+Vpixel_noise to the ramp signal generation unit 330. The ramp signal generation unit 330 may output a ramp signal Vramp+A+Vpixel_noise, in which the pixel power noise is incorporated, based on the transferred reference voltage (A+Vpixel_noise) transferred from the noise control unit 320 to a node 'A'.

In detail, the reference voltage generation unit 310 may generate the reference voltage A+Vpixel_noise using the pixel supply voltage Vddpx and the pixel ground voltage Vsspx, which are supplied to a pixel outputting a pixel signal, and output the generated reference voltage to the noise control unit 320. At this time, 'A' represents a DC-level voltage, and Vpixel_noise represents pixel power noise. The reference voltage generation unit 310 may be implemented through well known technology using a resistor string.

The noise control unit 320 may transfer a voltage corresponding to the reference voltage A+Vpixel_noise to the node 'A', based on the reference voltage A+Vpixel_noise and a ramp ground voltage Vssramp. At this time, the transferred voltage does not contain noise caused by ramp ground bouncing but contains the pixel power noise. In other words, the noise control unit 320 may have a bandwidth capable of blocking high-frequency noise caused by ramp ground bouncing, and passing low-frequency noise contained in the pixel power.

For example, the noise control unit 320 may be implemented with a voltage regulator. That is, the noise control unit 320 may include a differential amplification unit 321 and a driving unit 322. The differential amplification unit 321 may receive the reference voltage and the transferred voltage, And the differential amplification unit 321 may generate an amplified signal corresponding to a voltage difference between the reference voltage and the transferred voltage. The driving unit 322 may receive the amplified signal and be coupled between the node 'A' and a terminal of the ramp ground voltage Vssramp.

The driving unit 322 may include an NMOS transistor which has a drain terminal coupled to the ramp signal generation unit 330 (i.e., the node 'A'), a gate terminal receiving an output signal of the differential amplification unit 321, and a source terminal coupled to the ramp ground voltage Vssramp. The transferred voltage may be generated from the drain node coupled to the ramp signal generation unit 300, fed back to the differential amplification unit 321, and provided as a bottom voltage to the ramp signal generation unit 330.

The ramp signal generation unit 330 may include a ramp current generation unit 11 and a ramp resistor 12. The ramp current generation unit 11 may generate a ramp current corresponding to the ramp signal using the ramp supply voltage Vddramp, and the ramp resistor 12 may output the ramp signal Vramp+A+Vpixel_noise, based on the ramp current and the transferred voltage.

The ramp current generation unit 11 may be coupled between a supply terminal of the ramp supply voltage Vddramp and an output terminal of the ramp signal Vramp+A+Vpixel_noise, and the ramp resistor 12 may be coupled between the output terminal of the ramp signal Vramp+A+Vpixel_noise and the node 'A'.

As such, the ramp signal Vramp+A+Vpixel_noise outputted from the ramp signal generation unit 330 may be adjusted by the reference voltage in which pixel power noise is incorporated without ramp ground bouncing.

The pixel supply voltage Vddpx and the pixel ground voltage Vsspx may be used for generating the reference voltage A+Vpixel_noise, the ramp supply voltage Vddramp may be used in the ramp signal generation unit 330, and the ramp ground voltage Vssramp may be coupled to the noise control unit 320. Thus, the ramp ground and the pixel ground may be separately used.

FIG. 4 is a diagram illustrating an image sensor in accordance with an embodiment of the present invention. FIG. 4 illustrates that pixel power noise is offset through CDS when a pixel signal and a ramp signal are applied to a differential input terminal of a comparator.

As illustrated in FIG. 4, the image sensor in accordance with the embodiment of the present invention may include a pixel 410, a ramp signal generator 420, and a comparator 430. The pixel 410 may denote a pixel included in a pixel array. The pixel 410 may output a pixel signal Pixel_out+Vpixel_noise, in which pixel power noise is contained, using pixel powers Vddpx and Vsspx. The ramp signal generator 420 may remove high-frequency noise by controlling ramp ground bouncing, and generate a ramp signal Vramp+A+Vpixel_noise in which the pixel power noise is incorporated. The comparator 430 may compare the pixel signal Pixel_out+Vpixel_noise with the ramp signal Vramp+A+Vpixel_noise, and offset pixel power noise. The comparator 430 may output a comparison result to a counter.

The ramp signal generator 420 may be implemented as described with reference to FIG. 3. Furthermore, since the pixel 410 and the comparator 430 are publicly known, the detailed descriptions thereof are omitted herein.

As described above, the image sensor may remove high-frequency noise caused by the ramp ground bouncing by controlling ramp ground bouncing through the driving unit, separate the ramp ground and the pixel ground, and incorporate pixel power noise into an output of a ramp signal through the reference voltage generation unit implemented with pixel power, thereby inducing the pixel power noise to be offset at the differential input terminal of CDS.

Furthermore, since the change of ramp ground bouncing based on the change of current is controlled when the gain is changed, the linearity of the gain may be improved.

Embodiments of the present invention may be applied to various circuits using a switched current ramp signal generator.

Although various embodiments have been described for illustrative purposes, it will be apparent to those skilled in the art, that various changes and modifications may be made without departing from the spirit and scope of the invention as defined in the following claims.

What is claimed is:

1. A ramp signal generator comprising:
a differential amplification unit suitable for receiving a reference voltage and a voltage of a transfer node, corresponding to the reference voltage as differential inputs;
a driving unit suitable for receiving an output signal of the differential amplification unit and being coupled between the transfer node and a ramp ground voltage terminal; and
a ramp signal generation unit suitable for generating a ramp signal based on a ramp supply voltage and the voltage of the transfer node,
wherein the ramp signal generation unit comprises:
a ramp current generation unit coupled between a ramp supply voltage terminal and a ramp signal output terminal, and suitable for generating a ramp current corresponding to the ramp signal; and
a ramp resistor coupled between the ramp signal output terminal and the transfer node;
wherein the ramp signal generator controls ramp ground bouncing to cancel noise caused by the ramp ground bouncing.

2. A ramp signal generator comprising:
a reference voltage generation unit suitable for generating a reference voltage using pixel powers;
a noise control unit suitable for generating a voltage corresponding to the reference voltage using a ramp ground voltage; and
a ramp signal generation unit suitable for generating a ramp signal based on a ramp supply voltage and the voltage generated from the noise control unit,
wherein the ramp signal generation unit comprises:
a ramp current generation unit coupled between the ramp supply voltage terminal and a ramp signal output terminal, and suitable for generating a ramp current corresponding to the ramp signal; and
a ramp resistor coupled between the ramp signal output terminal and an output terminal of the noise control unit;
wherein the reference voltage contains pixel power noise, and
the pixel power noise is incorporated into the voltage generated from the noise control unit and the ramp signal without containing noise caused by ramp ground bouncing.

3. The ramp signal generator of claim 2, wherein the noise control unit comprises a voltage regulator suitable for controlling ramp ground bouncing based on the reference voltage to cancel noise caused by the ramp ground bouncing.

4. The ramp signal generator of claim 3, wherein the noise control unit comprises:
   a differential amplification unit suitable for receiving the reference voltage and the voltage generated from the noise control unit, as differential inputs; and
   a driving unit suitable for receiving an output signal of the differential amplification unit and being coupled between an output terminal of the noise control unit and a ramp ground voltage terminal.

5. The ramp signal generator of claim 2, wherein the pixel power comprises a pixel supply voltage and a pixel ground voltage,
   the pixel supply voltage and the ramp supply voltage are electrically separated, and
   the pixel ground voltage and the ramp ground voltage are electrically separated.

6. An image sensor comprising:
   a pixel array suitable for generating a pixel signal in which a pixel power noise is incorporated using a pixel supply voltage and a pixel ground voltage;
   a ramp signal generator suitable for generating a ramp signal on which the pixel power noise is reflected using the pixel supply voltage, the pixel ground voltage, a ramp supply voltage, and a ramp ground voltage; and
   a comparator suitable for comparing the pixel signal and the ramp signal,
   wherein the ramp signal generator comprises:
   a ramp signal generation unit;
   wherein the ramp signal generation unit comprises:
   a ramp current generation unit coupled between the ramp supply voltage terminal and a ramp signal output terminal, and suitable for generating a ramp current corresponding to the ramp signal; and
   a ramp resistor coupled between the ramp signal output terminal and an output terminal of the noise control unit;
   wherein the ramp signal generator controls ramp ground bouncing to cancel noise caused by the ramp ground bouncing.

7. The image sensor of claim 6, wherein the ramp signal generator comprises:
   a reference voltage generation unit suitable for generating a reference voltage on which the pixel power noise is reflected, using the pixel supply voltage and the pixel ground voltage;
   a noise control unit suitable for generating a voltage corresponding to the reference voltage using the ramp ground voltage; and
   the ramp signal generation unit suitable for generating the ramp signal based on the ramp supply voltage and the voltage generated from the noise control unit.

8. The image sensor of claim 7, wherein the noise control unit comprises a voltage regulator suitable for controlling ramp ground bouncing based on the reference voltage to cancel the noise caused by the ramp ground bouncing.

9. The image sensor of claim 8, wherein the noise control unit comprises:
   a differential amplification unit suitable for receiving the reference voltage and the voltage generated from the noise control unit, as differential inputs; and
   a driving unit suitable for receiving an output signal of the differential amplification unit and being coupled between an output terminal of the noise control unit and a ramp ground voltage terminal.

10. The image sensor of claim 7, wherein the pixel supply voltage and the ramp supply voltage are electrically separated, and
    the pixel ground voltage and the ramp ground voltage are electrically separated.

11. The image sensor of claim 6, wherein the comparator offsets the pixel power noise contained in the pixel signal by using the ramp signal in which the pixel power noise is incorporated, and generates a comparison signal from which the power pixel noise is canceled.

* * * * *